United States Patent
Bode

(10) Patent No.: US 9,893,739 B2
(45) Date of Patent: Feb. 13, 2018

(54) ANALOGUE TO DIGITAL CONVERTER

(71) Applicant: NXP USA, Inc., Austin, TX (US)

(72) Inventor: Hubert Martin Bode, Vieille-Toulouse (FR)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/602,388

(22) Filed: May 23, 2017

(65) Prior Publication Data

US 2017/0346499 A1 Nov. 30, 2017

(30) Foreign Application Priority Data

May 31, 2016 (EP) .................................... 16172240

(51) Int. Cl.
*H03M 1/10* (2006.01)
*H03M 1/38* (2006.01)

(52) U.S. Cl.
CPC ........... *H03M 1/38* (2013.01); *H03M 1/1023* (2013.01)

(58) Field of Classification Search
CPC ........ H03M 1/38; H03M 1/1023; H03M 1/66; H03M 1/68; H03M 2201/814; H03M 1/00; H03M 1/12
USPC ......................................... 341/155, 161, 120
See application file for complete search history.

(56) References Cited

U.S. PATENT DOCUMENTS

| | | | |
|---|---|---|---|
| 6,400,302 B1 * | 6/2002 | Amazeen | H03M 1/68 341/150 |
| 6,538,594 B1 | 3/2003 | Somayajula | |
| 7,046,178 B2 * | 5/2006 | Draxelmayr | H03M 1/1033 341/120 |
| 7,812,757 B1 * | 10/2010 | Wong | H03M 1/468 341/155 |
| 7,868,796 B2 | 1/2011 | Berens et al. | |
| 8,674,862 B1 * | 3/2014 | Li | H03M 1/10 341/120 |
| 9,030,346 B2 | 5/2015 | Dey et al. | |
| 9,048,860 B1 * | 6/2015 | Quinn | H03M 1/46 |
| 9,071,265 B1 | 6/2015 | Dey et al. | |
| 9,287,891 B1 * | 3/2016 | Lee | H03M 1/0641 |
| 9,319,059 B1 * | 4/2016 | Sharma | H03M 1/38 |
| 2004/0227652 A1 * | 11/2004 | Draxelmayr | H03M 1/1033 341/120 |
| 2010/0079319 A1 | 4/2010 | Berens et al. | |
| 2011/0030448 A1 | 12/2011 | Christer et al. | |

(Continued)

*Primary Examiner* — Jean B Jeanglaude
(74) *Attorney, Agent, or Firm* — Rajeev Madnawat

(57) ABSTRACT

A SAR ADC is disclosed. The SAR ADC includes a plurality of SAR-capacitors. For each of the SAR-capacitors, a sampling-switching-block is configured to connect a first plate of the associated SAR-capacitor to either: v-ref-low, v-ref-high or an input-voltage. The SAR ADC also includes an offset-capacitor and an offset-switching-block configured to connect a first plate of the offset-capacitor to either: v-ref-low, or v-ref-high. The SAR ADC further includes a SAR machine configured to provide signals to the sampling-switching-blocks and the offset-switching-block in order to define a calibration-sampling-mode-of-operation, a calibration-conversion-mode-of-operation, a sampling-mode-of-operation and a conversion-mode-of-operation. A code converter is also includes and is configured to subtract the offset-value from the raw-digital-word in order to provide a digital-output-signal.

15 Claims, 5 Drawing Sheets

(56) References Cited

U.S. PATENT DOCUMENTS

| | | | |
|---|---|---|---|
| 2012/0146712 A1* | 6/2012 | Kull | G11C 5/147 327/530 |
| 2013/0044015 A1* | 2/2013 | Reinhold | H03M 1/1061 341/110 |
| 2013/0162454 A1* | 6/2013 | Lin | H03M 1/38 341/120 |
| 2013/0249723 A1 | 9/2013 | Dey et al. | |
| 2015/0180498 A1* | 6/2015 | Yang | H03M 1/403 341/120 |

* cited by examiner

ANALOGUE TO DIGITAL CONVERTER

CROSS-REFERENCE TO RELATED APPLICATIONS

This application claims the priority under 35 U.S.C. §119 of European Patent application no. 16172240.0, filed on May 31, 2016, the contents of which are incorporated by reference herein.

The present disclosure relates to analogue to digital converters (ADCs), and in particular to successive approximation register (SAR) ADCs.

According to a first aspect of the present disclosure there is provided a SAR ADC comprising:
- a plurality of SAR-capacitors;
- for each of the SAR-capacitors, a sampling-switching-block configured to connect a first plate of the associated SAR-capacitor to either: v-ref-low, v-ref-high or an input-voltage;
- an offset-capacitor;
- an offset-switching-block configured to connect a first plate of the offset-capacitor to either: v-ref-low, or v-ref-high;
- a SAR machine configured to:
  - provide signals to the sampling-switching-blocks and the offset-switching-block in order to define a calibration-sampling-mode-of-operation, a calibration-conversion-mode-of-operation, a sampling-mode-of-operation and a conversion-mode-of-operation, wherein:
    - in the calibration-sampling-mode-of-operation, the SAR-capacitors are connected to v-ref-low, and the offset-capacitor is connected to v-ref-high;
    - in the calibration-conversion-mode-of-operation, the SAR-capacitors are connected to either v-ref-low or v-ref-high, and the offset-capacitor is connected to v-ref-low;
    - in the sampling-mode-of-operation, one or more of the SAR-capacitors are connected to the input-voltage, and the offset-capacitor is connected to v-ref-high; and
    - in the conversion-mode-of-operation, the SAR-capacitors are connected to either v-ref-low or v-ref-high, and the offset-capacitor is connected to v-ref-low; and
  - determine an offset-value based on whether the SAR-capacitors are connected to v-ref-low or v-ref-high at an end of the calibration-conversion-mode-of-operation;
  - provide a raw-digital-word based on whether the SAR-capacitors are connected to v-ref-low or v-ref-high at an end of the conversion-mode-of-operation; and
- a code converter configured to subtract the offset-value from the raw-digital-word in order to provide a digital-output-signal.

In one or more embodiments the SAR machine is configured to provide a calibration-digital-word based on whether the SAR-capacitors are connected to v-ref-low or v-ref-high at an end of the calibration conversion-mode-of-operation. The SAR ADC may be configured to determine the offset-value based on the calibration-digital-word.

In one or more embodiments, in the sampling-mode-of-operation, the SAR machine is configured to connect a first-subset of the SAR-capacitors to the input-voltage. In the sampling-mode-of-operation, the SAR machine may be configured to connect a second-subset of the SAR-capacitors to v-ref-low. In the conversion-mode-of-operation, the SAR machine may be configured to connect all of the SAR-capacitors to either v-ref-low or v-ref-high.

In one or more embodiments the SAR ADC further comprises: a range-extender-capacitor; and a range-extender-switching-block configured to connect a first plate of the range-extender-capacitor to either: v-ref-low, or the input-voltage. The SAR machine may be configured to provide signals to the range-extender-switching-block such that: in the sampling-mode-of-operation, the range-extender-capacitor is connected to the input-voltage; and in the conversion-mode-of-operation, the range-extender-capacitor is connected to v-ref-low.

In one or more embodiments the SAR machine is configured to provide signals to the range-extender-switching-block such that:
- in the calibration-sampling-mode-of-operation, the range-extender-capacitor is connected to v-ref-low; and
- in the calibration-conversion-mode-of-operation, the range-extender-capacitor is connected to v-ref-low.

In one or more embodiments the SAR ADC further comprises a comparator, wherein the comparator has a first-comparator-input-terminal and a second-comparator-input-terminal. The first-comparator-input-terminal may be connected to second plates of each of the SAR-capacitors and the offset-capacitor. The second-comparator-input-terminal may be configured to be selectively connected to an autozero-voltage-supply.

In one or more embodiments the offset-capacitor is configured to provide an additional-voltage to the first-comparator-input-terminal when it is connected to v-ref-high.

In one or more embodiments the SAR ADC further comprises an autozero-switching block configured to:
- connect a second plate of each of the SAR-capacitors to the autozero-voltage-supply in the sampling-mode-of-operation, and
- disconnect the second plate of each of the SAR-capacitors from the autozero-voltage-supply in the conversion-mode-of-operation.

In one or more embodiments the autozero-switching block is configured to:
- connect the second-comparator-input-terminal to the autozero-voltage-supply in the sampling-mode-of-operation, and
- disconnect the second-comparator-input-terminal from the autozero-voltage-supply in the conversion-mode-of-operation.

In one or more embodiments the autozero-switching block is configured to:
- connect the second plate of each of the SAR-capacitors to the autozero-voltage-supply in the calibration-sampling-mode-of-operation, and
- disconnect the second plate of each of the SAR-capacitors from the autozero-voltage-supply in the calibration-conversion-mode-of-operation.

In one or more embodiments the autozero-switching block is configured to:
- connect the second-comparator-input-terminal to the autozero-voltage-supply in the calibration-sampling-mode-of-operation, and
- disconnect the second-comparator-input-terminal from the autozero-voltage-supply in the calibration-conversion-mode-of-operation.

In one or more embodiments the SAR ADC further comprises a reference-capacitor-array and a reference-switching-block. The reference-capacitor-array may comprise one or more reference-capacitors. Each reference-capacitor may have a second plate that is connected to the second-comparator-input-terminal of the comparator; and a first plate that is connected to the reference-switching-block. The capacitance of the reference-capacitor-array may correspond to the capacitance of the capacitors that are connected to the first-comparator-input-terminal.

There may be provided an electronic device comprising any SAR ADC disclosed herein.

There may be provided a method of operating a SAR ADC, wherein the SAR ADC comprises a plurality of SAR-capacitors; a sampling-switching-block for each of the SAR-capacitors; an offset-capacitor; and an offset-switching-block, wherein the method comprises:

providing signals to the sampling-switching-blocks and the offset-switching-block in order to define a calibration-sampling-mode-of-operation, a calibration-conversion-mode-of-operation, a sampling-mode-of-operation and a conversion-mode-of-operation, wherein:
  in the calibration-sampling-mode-of-operation, the SAR-capacitors are connected to v-ref-low, and the offset-capacitor is connected to v-ref-high;
  in the calibration-conversion-mode-of-operation, the SAR-capacitors are connected to either v-ref-low or v-ref-high, and the offset-capacitor is connected to v-ref-low;
  in the sampling-mode-of-operation, one or more of the SAR-capacitors are connected to an input-voltage, and the offset-capacitor is connected to v-ref-high; and
  in the conversion-mode-of-operation, the SAR-capacitors are connected to either v-ref-low or v-ref-high, and the offset-capacitor is connected to v-ref-low; and
determining an offset-value based on whether the SAR-capacitors are connected to v-ref-low or v-ref-high at an end of the calibration-conversion-mode-of-operation
determining a raw-digital-word based on whether the SAR-capacitors are connected to v-ref-low or v-ref-high at an end of the conversion-mode-of-operation; and
subtracting the offset-value from the raw-digital-word in order to provide a digital-output-signal.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which:

FIG. 1 shows a successive approximation register analogue-to-digital converter (SAR ADC) 100 for converting an analogue input signal (Vin) 106 into an output digital code 112.

Figure 1:
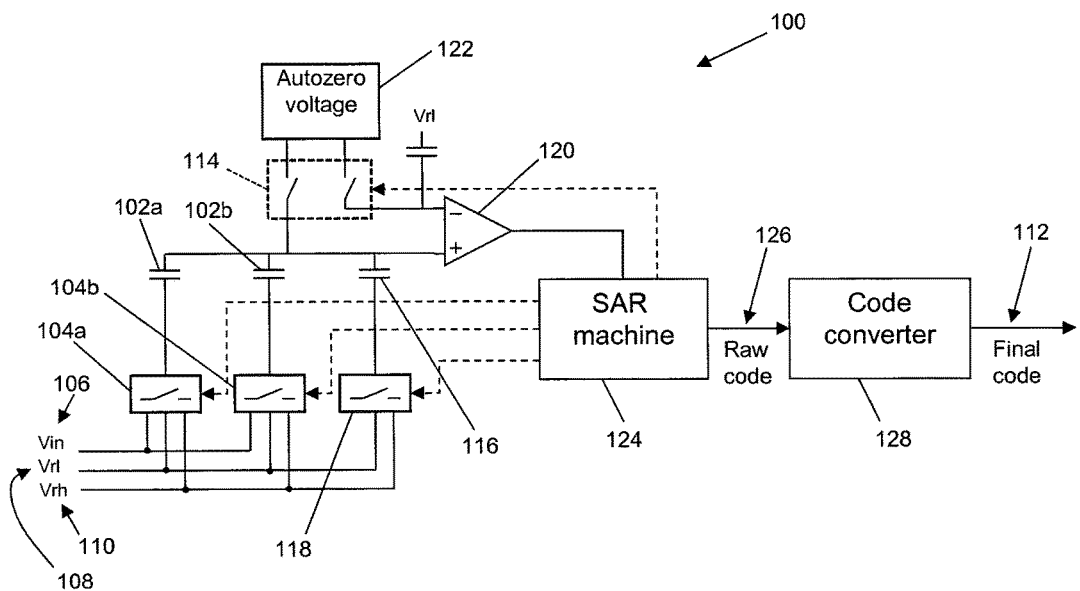
FIG. 1 shows an example embodiment of a successive approximation register analogue-to-digital converter (SAR ADC)

The SAR ADC 100 includes a plurality of SAR-capacitors 102a, 102b. In FIG. 1 only two SAR-capacitors are shown, although in other examples there may be many more. For example fourteen SAR-capacitors may be used to provide a 14 bit digital code 112 that is representative of the received analogue input signal 106. As will be discussed below with respect to FIG. 4, a first-subset of the SAR-capacitors may be used to sample the analogue input signal 106 during a sampling-mode-of-operation, and all of the SAR-capacitors can be used during a conversion-mode-of-operation to generate the digital code 112.

A sampling-switching-block 104a, 104b is connected to each of the SAR-capacitors 102a, 102b. Each sampling-switching-block 104a, 104b can selectively connect a first plate of the associated SAR-capacitor 102a, 102b to either: v-ref-low (Vrl) 108, v-ref-high (Vrh) 110 or the analogue input signal (Vin) 106. As will be discussed below, the analogue input signal (Vin) 106 is used to determine a sampled value of the input signal, and v-ref-low (Vrl) 108 and v-ref-high (Vrh) 110 are used to set the digital code 112 during a conversion-mode-of-operation. In some examples, v-ref-low (Vrl) 108 can be ground, and v-ref-high (Vrh) 110 can be a positive voltage level that is available to the SAR ADC, such as a 5V internal power supply.

The second plates of each of the SAR-capacitors 102a, 102b are connected to a positive input of a comparator 120. An autozero-voltage-supply 122 is selectively connected to both the positive input and negative input of the comparator 120 by an autozero-switching block 114. The positive input of the comparator 120 is an example of a first-comparator-input-terminal, and the negative input of the comparator 120 is an example of a second-comparator-input-terminal. In other examples, the polarity of the comparator inputs may be reversed.

The voltage level of the autozero-voltage-supply 122 is selected for the specific implementation of the comparator that is being used, for example based on operating parameters of the comparator 120, and its specific value is not critical to the functionality of the circuit that will be described below.

The comparator 120 has a comparator-output terminal, which provides a comparator-output-signal to a SAR machine 124. The SAR machine 124 provides control signals to the sampling-switching-blocks 104a, 104b and the autozero-switching block 114 in order to define the following modes of operation:
  a calibration-sampling-mode-of-operation;
  a calibration-conversion-mode-of-operation;
  a sampling-mode-of-operation; and
  a conversion-mode-of-operation.

In the calibration-sampling-mode-of-operation, the SAR machine 124 controls the sampling-switching-blocks 104a, 104b such that the first plates of the SAR-capacitors 102a, 102b are connected to v-ref-low 108. Also, the SAR machine 124 controls the autozero-switching block 114 such that the autozero-voltage-supply 122 is connected to both the positive input and negative input of the comparator 120.

Then, in the calibration-conversion-mode-of-operation, the SAR machine 124 controls the autozero-switching block 114 such that the autozero-voltage-supply 122 is disconnected from both the positive input and negative input of the comparator 120. Also, the SAR machine 124 controls the sampling-switching-blocks 104a, 104b such that, starting from the SAR-capacitor 102a, 102b that represents the most significant bit (MSB), and sequentially working through the SAR-capacitors 102a, 102b in order of significance, the first plate of the SAR-capacitor 102a, 102b is connected to v-ref-high 110 such that the states of the sampling-switching-blocks 104a, 104b define an interim-digital-word. The comparator 120 then compares (i) the voltage at the second plates of the SAR-capacitors 102a, 102b during the calibration-conversion-mode-of-operation, which is generated in accordance with the interim-digital-word, with (ii) the voltage at the second plates of the SAR-capacitors 102a, 102b during the preceding calibration-sampling-mode-of-operation.

The SAR machine 124 then processes the output of the comparator 120 to determine if the interim-digital-word is too high or too low. If the interim-digital-word is too high, then the sampling-switching-block 104a, 104b for the most recently processed SAR-capacitor 102a, 102b is set such that it connects the capacitor to Vrl 108 (which is representative of a binary 0), and if the interim-digital-word is too low, then the sampling-switching-block 104a, 104b for the most recently processed SAR-capacitor 102a, 102b is set such that it maintains the connection to Vrh 110 (which is representative of a binary 1).

Since each of the first plates of the SAR-capacitors 102a, 102b were connected to v-ref-low 108 during the calibration-sampling-mode-of-operation, the SAR machine identifies a calibration-digital-word, after having performed a comparison for each of the SAR-capacitors 102a, 102b, that is representative of an offset that exists in the SAR ADC 100. The SAR ADC 100 then determines an offset-value based on the calibration-digital-word, and stores the offset-value for use when performing a subsequent analogue to digital conversion on a received analogue input signal. In this way, the offset-value is determined based on the calibration-digital-word, which is representative of whether the SAR-capacitors 102a, 102b are connected to Vrl 108 or Vrh 110 at the end of the calibration-conversion-mode-of-operation.

In this way, the calibration-sampling-mode-of-operation and the calibration-conversion-mode-of-operation are used to determine an offset-value for the SAR ADC 100. The offset-value can be non-zero due to mismatches in the values of the SAR-capacitors 102a, 102b, errors in the comparator 120, etc.

The, then sampling-mode-of-operation and the conversion-mode-of-operation are applied to perform the analogue to digital conversion on the received analogue input signal 106.

In the sampling-mode-of-operation, the SAR machine 124 controls the sampling-switching-blocks 104a, 104b such that the first plates of one or more of the SAR-capacitors 102a, 102b are connected to Vin 106. Any SAR-capacitors 102a, 102b that are not connected to Vin 108 can be connected to Vrl 108. Also, the SAR machine 124 controls the autozero-switching block 114 such that the autozero-voltage-supply 122 is connected to both the positive input and negative input of the comparator 120.

Then, in the conversion-mode-of-operation, the SAR machine 124 controls the autozero-switching block 114 such that the autozero-voltage-supply 122 is disconnected from both the positive input and negative input of the comparator 120. Also, the SAR machine 124 controls the sampling-switching-blocks 104a, 104b such that the SAR-capacitors 102a, 102b are sequentially connected to either Vrl 108 or Vrh 110, in the same way as during the calibration-conversion-mode-of-operation. In this way, at the end of the conversion-mode-of-operation, a raw-digital-word 126 is determined by the SAR machine 124, which is representative of the analogue input signal that was sampled during the sampling-mode-of-operation.

The SAR machine 124 passes the raw-digital-word 126 to the code converter 128. The code converter 128 subtracts the previously determined offset-value from the raw-digital-word 126 in order to provide the digital output code 112.

Figure 2:
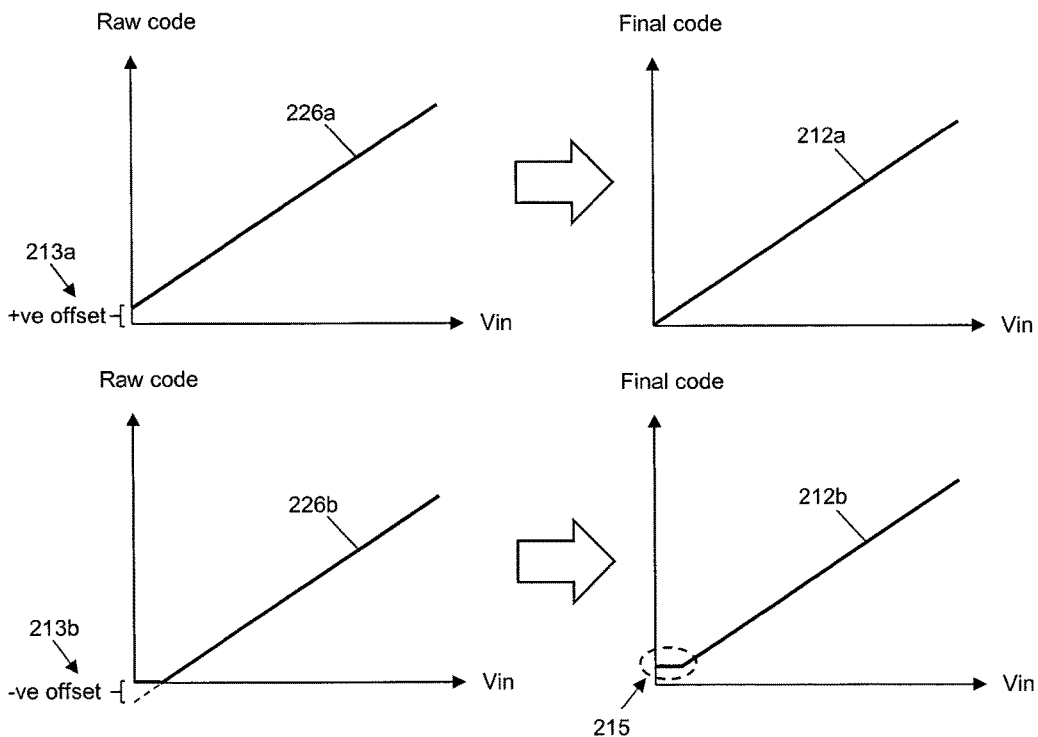
FIG. 2 shows example raw-digital-words and associated digital output codes that can occur using only some of the functionality of FIG. 1.

FIG. 2 shows some example raw-digital-words 226 and associated digital output codes 212 that can occur using the processing described above.

In FIG. 2, the upper two plots represent a scenario where the SAR ADC introduces a positive offset 213a. This can be seen because the raw-digital-word 226a has a positive value when Vin=0. The associated digital output code 212a can therefore be adequately corrected by subtracting the offset-value as discussed above.

The lower two plots in FIG. 2 represent a scenario where the SAR ADC introduces a negative offset 213b. This can be seen because the raw-digital-word 226a does not start to increase until the associated value of Vin is greater than zero. In this scenario, it may not be possible for the associated digital output code 212b to be adequately corrected because the SAR ADC may not be capable of processing negative numbers. Therefore, when the offset-value is subtracted, the digital output code 212b includes a "blind-spot" 215 for low values of the analogue input signal (Vin), in which Vin cannot be correctly converted to a digital word. That is, there are some missing codes.

Returning now to FIG. 1, in this example, the SAR ADC 100 also includes an offset-capacitor 116 and an offset-switching-block 118. Use of these components can reduce or remove the disadvantage of missing codes that was described with reference to FIG. 2.

The offset-switching-block 118 can connect a first plate of the offset-capacitor 116 to either: v-ref-low (Vrl) 108 or v-ref-high (Vrh) 110. As will be discussed below, the offset-capacitor 116 can be used to apply an offset to the sampled analogue input signal that can enable any mismatches in component values, or other discrepancies, to be adequately accounted for, irrespective of whether those discrepancies would otherwise result in a positive or negative offset.

In addition to the control of the sampling-switching-blocks 104a, 104b and the autozero-switching block that is described above, the SAR machine 124 controls the offset-switching-block 118 as follows.

In the calibration-sampling-mode-of-operation, the offset-capacitor 116 is connected to Vrh 110. Therefore, an artificially high voltage is sampled during the calibration-sampling-mode-of-operation. This is because an additional-voltage is sampled due to the offset-capacitor 116 being driven high. In the calibration-conversion-mode-of-operation, the offset-capacitor 116 is connected to Vrl 108. Consequently, an artificially high offset-value is determined during the calibration-conversion-mode-of-operation.

Then, during the sampling-mode-of-operation, the offset-capacitor 116 is connected to Vrh 110. Therefore, an artificially high voltage is sampled during the sampling-mode-of-operation, which corresponds to the analogue input signal 106 plus an additional-voltage due to the offset-capacitor 116 being driven high. In the conversion-mode-of-operation, the offset-capacitor 116 is connected to Vrl 108. Consequently, an artificially high raw-digital code is determined by the SAR machine 124.

However, since the same "additional-voltage" was sampled during the calibration-sampling-mode-of-operation when the offset-value was determined, the code converter 128 automatically removes the effect of the additional-voltage when it subtracts the offset-value, and therefore the additional-voltage is not included in the output digital word 112.

Figure 3:
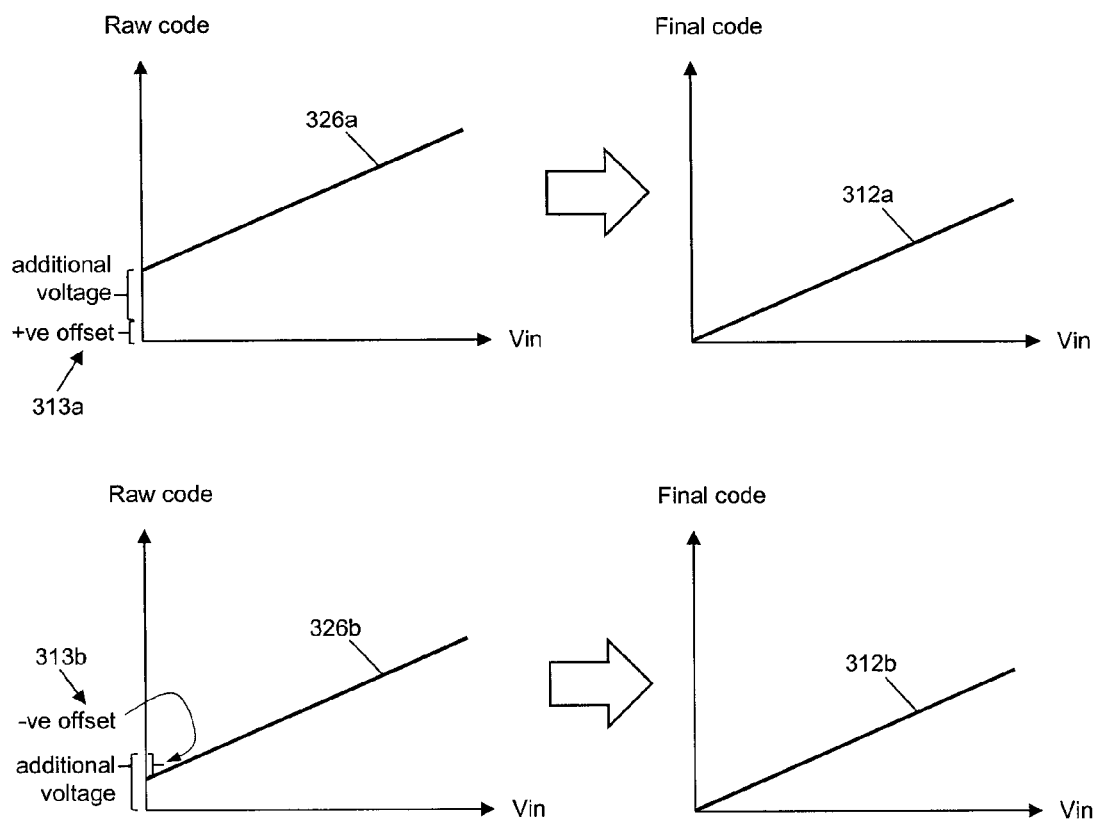
FIG. 3 shows example raw-digital-words and associated digital output codes that can occur using the offset-capacitor functionality of FIG. 1.

FIG. 3 shows some example raw-digital-words 326 and associated digital output codes 312 that can occur using the offset-capacitor as described above.

In FIG. 3, the upper two plots represent a scenario where the SAR ADC introduces a positive offset 313a, in a similar same way to the corresponding plots of FIG. 2. In this example, the raw-digital-word 326a starts at an even higher positive value for Vin=0. This is because of the additional-voltage that is sampled due to the fact that the offset-capacitor is driven high during sampling. The associated digital output code 312a can again be adequately corrected by subtracting the calculated offset-value that also takes into account the additional-voltage.

The lower two plots in FIG. 3 represent a scenario where the SAR ADC introduces a negative offset 313b, in a similar same way to the corresponding plots of FIG. 2. However, in contrast to FIG. 2, in FIG. 3 the raw-digital-word 326b starts at a positive value for Vin=0. This can be seen in FIG. 3 because the magnitude of the additional-voltage is greater than the magnitude of the negative offset 313b. Therefore, in this example, the associated digital output code 312b can be adequately corrected by subtracting the calculated offset-value (which also takes into account the additional-voltage). In this way, the "blind spot" that was described with reference to FIG. 2 has been removed.

As discussed above, use of the offset-capacitor can increase the likelihood of the SAR ADC being able to correctly convert an analogue input signal into a digital output code for a variety of offset values, including negative offset values. Furthermore, by selecting the size of the offset-capacitor as an appropriate value, any "blind spots" may be completely removed. As will be described below with reference to FIG. 4, implementation of an offset-capacitor may be relatively simple, and in some examples can involve reusing a capacitor that is already present in the SAR ADC circuit. For example, a capacitor that can be used as an offset-capacitor can be included in the circuit for use during a self-test mode of operation, wherein the capacitor is operated in different ways at different times to separately perform the self-test functionality and the offset-based-functionality described above. Alternatively, one of the SAR-capacitors that is not being used (in that it is connected to Vrl) during the calibration-sampling-mode-of-operation and the sampling-mode-of-operation, can be used as the offset-capacitor.

Also, the required headroom, to account for the additional-voltage being added to a high Vin value may already be available in the SAR ADC circuit because it can be useful for other processing that SAR ADC may perform.

Figure 4:
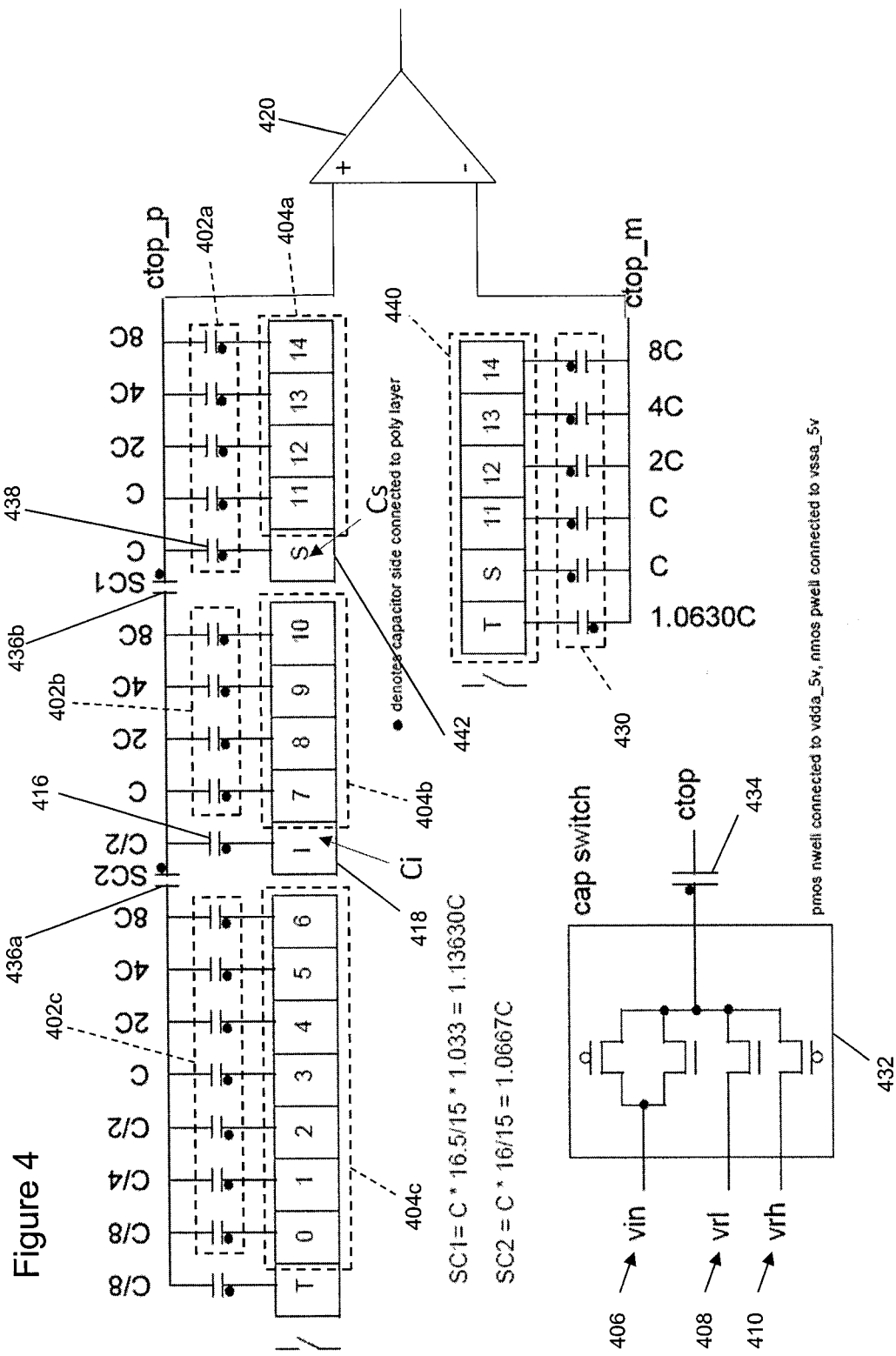
FIG. 4 shows further details of an example of a capacitor array that can be used with the SAR ADC of FIG. 1.

FIG. 4 shows further details of an example of a capacitor array that can be used with the SAR ADC of FIG. 1.

In this example, fifteen SAR-capacitors 402a, 402b, 402c are included, each with an associated sampling-switching-block 404, 404b, 404c. The values of the fifteen SAR-capacitors 402a, 402b, 402c are binary weighted.

A range-extender-capacitor (Cs) 438 is also included for extending the range of the raw-code that can be processed, as will be discussed below. A range-extender-switching-block 442 can selectively connect a first plate of the range-extender-capacitor (Cs) 438 to either: v-ref-low (Vrl) 408 or the analogue input signal (Vin) 406. A second plate of the range-extender-capacitor (Cs) 438 is connected to the positive input of the comparator 420.

In this example, two scaling capacitors 436a, 436b are included in series between adjacent banks of SAR-capacitors (wherein SAR-capacitors are provided in parallel with each other in a bank). The first scaling capacitor (SC1) 436b is oversized in this example to allow for linearity correction of C11 to C14. Although these scaling capacitors 436a, 436b can result in a discontinuity in the raw code that is output by the SAR machine as will be discussed below, they can enable smaller capacitor values, and therefore physically smaller areas, to be used whilst still enabling a large binary number to be represented by the SAR-capacitors.

An offset-capacitor 416 and associated offset-switching-block 418 are also shown. An example implementation of a switching-block 432 is shown in the bottom left corner of FIG. 4. The switching-block 432 includes a number of switches/FETs for connecting one of Vin 406, Vrl 408 and Vrh 410 to the first (bottom) plate of an associated capacitor 434. The way in which the offset-capacitor 416 and the associated offset-switching-block 418 are controlled, as will be discussed below, can advantageously reduce the likelihood of a "blind spot" such as the one illustrated in FIG. 2.

In the calibration-sampling-mode-of-operation, the SAR machine (not shown) controls:
the sampling-switching-blocks 404a, 404b, 404c such that the first plates of each of the SAR-capacitors 402a, 402b, 402c are connected to Vrl 408;
the range-extender-switching-block 442 such that the first plate of the range-extender-capacitor (Cs) 438 is connected to Vrl 408;
the offset-switching-block 118 such that the offset-capacitor 416 is connected to Vrh 410; and
an autozero-switching block (not shown) such that an autozero-voltage-supply (also not shown) is connected to both the positive input and negative input of the comparator 420.

In the calibration-conversion-mode-of-operation, the SAR machine controls:
the autozero-switching block such that the autozero-voltage-supply is disconnected from both the positive input and negative input of the comparator 420;
the range-extender-switching-block 442 such that the first plate of the range-extender-capacitor (Cs) 438 is connected to Vrl 408;
the sampling-switching-blocks 404a, 404b, 404c such that, starting from the SAR-capacitor that represents the most significant bit (MSB) (capacitor 14 in this example) the first plate of the SAR-capacitor is connected to Vrh 410.

Then, after the sampling-switching-block 404a, 404b, 404c has connected a SAR-capacitor to Vrh 410, a comparison is performed in the same way as discussed above with reference to FIG. 1. The SAR machine then sequentially works through the SAR-capacitors in turn until all have been processed. In this example, due to the weight/value of the offset-capacitor 416, the calibration-digital-word that is determined after the calibration-conversion-mode-of-operation has been applied for each of the SAR-capacitors, is expected to be 1000000 (i.e. $2^6$). This is due to the additional-voltage that is sampled in the calibration-samplingmode-of-operation when the offset-capacitor is driven high (i.e. connected to Vrh 410). However, in practice, the calibration-digital-word will likely be slightly different to $2^6$ because of an offset that occurs in the SAR ADC, as discussed above.

In the sampling-mode-of-operation, the SAR machine controls:
- a first-subset of the sampling-switching-blocks 404a such that the first plates of a first-subset of the SAR-capacitors 402a are connected to Vin 406;
- the range-extender-switching-block 442 such that the first plate of the range-extender-capacitor (Cs) 438 is connected to Vin 406;
- a second-subset of the sampling-switching-blocks 404b, 404c such that the first plates of a second-subset of the SAR-capacitors 402b, 402c are connected to Vrl 408;
- the offset-switching-block 418 such that the offset-capacitor 416 is connected to Vrh 410; and
- the autozero-switching block such that the autozero-voltage-supply is connected to both the positive input and negative input of the comparator 420.

In this way, the analogue input voltage (Vin) 406 is sampled into a first subset of the SAR-capacitors 402a, the range of the raw-word that will be determined is extended by the range-extender-capacitor (Cs) 438, and an additional-voltage is also sampled because the offset-capacitor 416 is driven high at the same time. The unused SAR-capacitors (the second-subset 402b, 402c) are driven low (by being connected to Vrl 408) such that they do not contribute to the sampled voltage.

In the conversion-mode-of-operation, the SAR machine controls:
- the autozero-switching block such that the autozero-voltage-supply is disconnected from both the positive input and negative input of the comparator 420;
- the offset-switching-block 418 such that the offset-capacitor 416 is connected to Vrl 408;
- the range-extender-switching-block 442 such that the first plate of the range-extender-capacitor (Cs) 438 is connected to Vrl 408;
- the sampling-switching-blocks 404a, 404b, 404c such that all of the SAR-capacitors 402a, 402b, 402c are connected to either Vrl 408 or Vrh 410 in order to determine a raw-digital-word that is representative of the voltage that was sampled in the sampling-mode-of-operation, in the same way as discussed above.

In this example, a reference-capacitor-array 430, which includes one or more reference-capacitors, is also included. Each reference-capacitor in the reference-capacitor-array 430 has a second (top) plate that is connected to the negative input of the comparator 420, and a first (bottom) plate that is connected to a reference-switching-block 440. The capacitance of the reference-capacitor-array 430 corresponds to the capacitance of the capacitor array that is connected to the positive input of the comparator 420. The reference-switching-block 440 corresponds to the switching-blocks 404a, 404b, 404c associated with the positive input of the comparator 420. The reference-switching-block 440 permanently connects the first plates of the capacitors in the reference-capacitor-array 430 to Vrl 408, and is not used to change the connections of the capacitors during operation. The reference-capacitor-array 430 and the reference-switching-block 440 are included to provide a transient response at the negative input to the comparator 420 when the associated autozero-switching-block is controlled, wherein such a transient response is intended to mimic the transient response that occurs at the positive input to the comparator 420 when the corresponding autozero-switching-block is controlled.

The top-plate of the reference-capacitor-array 430 is connected to the negative input of the comparator 420. In an ideal world, the voltage on this input never changes. In reality however, the charge in both capacitor arrays (the main and the reference one) changes a bit when the autozero-switching-blocks (which connect each top-plate to the autozero voltage) are turned high ohmic (which defines the end of a sampling phase). In this example, the top-plate voltages at both the positive and negative inputs to the comparator 420 should jump by about same amount. This new voltage on the reference array is where we will compare the voltage on the main array for a subsequent conversion/comparison phase. By using the reference-capacitor-array 430, the effects of the charge injection of the autozero switching-blocks can be compensated.

Figure 5:
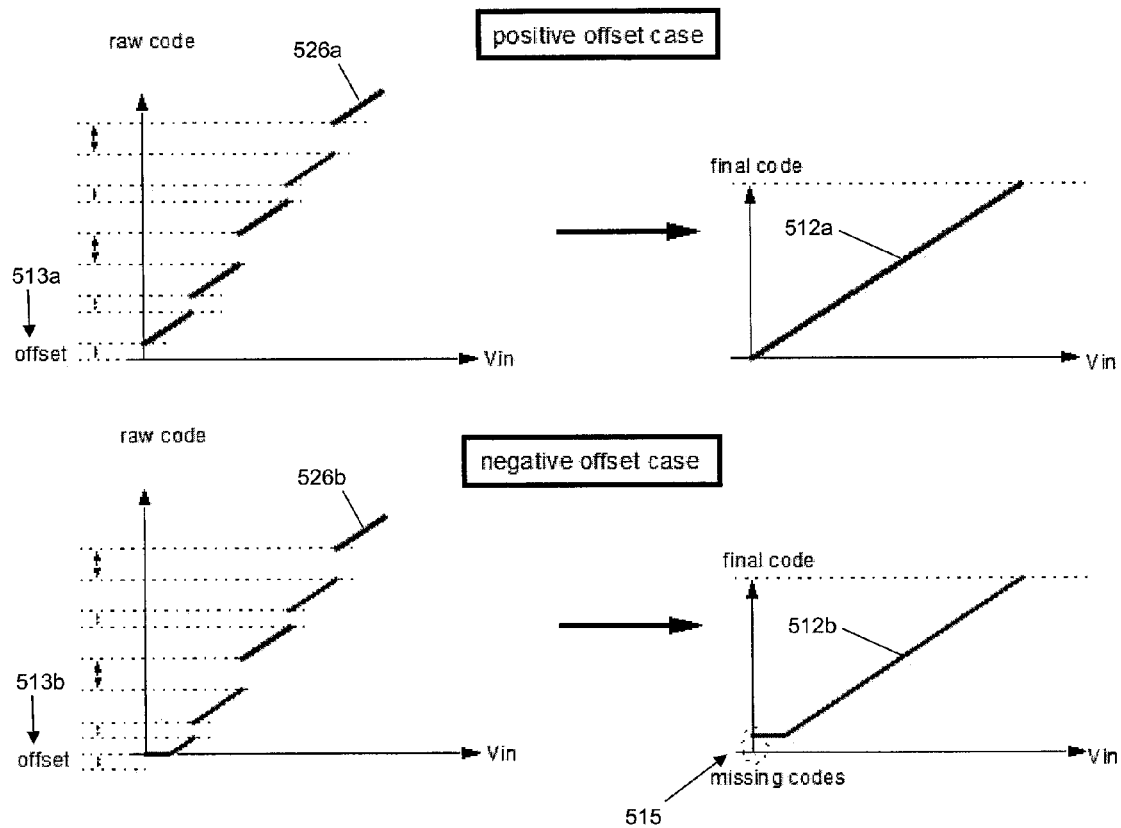
FIGS. 5 and 6 show example signals for the capacitor array of FIG. 4, which are similar to the signals shown in FIGS. 2 and 3.
Figure 6:
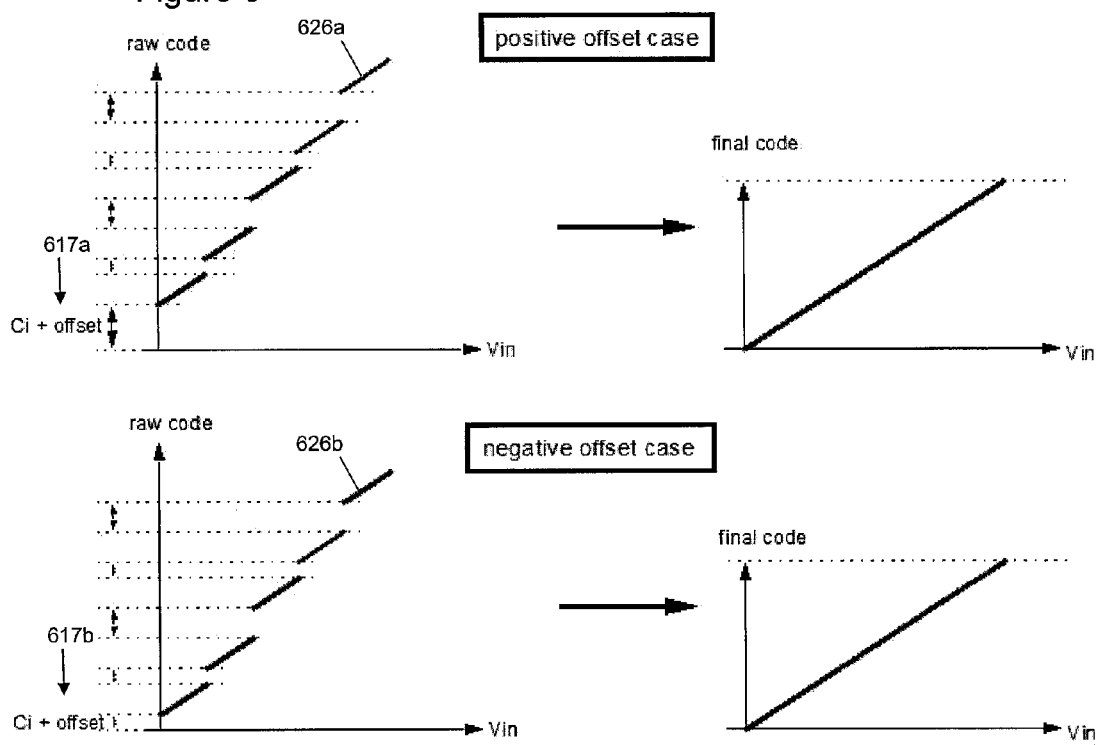

FIGS. 5 and 6 show example signals for the capacitor array of FIG. 4, which are similar to the signals shown in FIGS. 2 and 3. In FIG. 6, the combination of the additional-voltage and the offset are shown with a single reference number 617a, 617b. The discontinuities/non-linearity in the raw-digital-words 526a, b; 626a, b are due to the scaling capacitors in FIG. 4. These discontinuities can be measured in the calibration-conversion-mode-of-operation, and then removed by a code converter (not shown) at the same time as removing the offset-value.

As shown graphically in FIGS. 5 and 6, the raw code space is 6.25% bigger than the final code space, to allow the code subtraction for linearity correction. Use of the range-extender-capacitor (Cs), discussed above, can extend the range at the upper end of the raw code space for use in the linearity correction. Advantageously, the weight of the offset-capacitor (Ci) can be selected such that the associated additional-voltage fits into that space. The linearity correction can be implemented in line with the teachings of US 20110/0079319 A1 (Berens et al) and/or U.S. Pat. No. 9,071,265 B1 (Dey et al).

As will be appreciated from the above discussion, SAR ADCs that are calibrated for integral nonlinearity (INL) and/or differential nonlinearity (DNL) can show an offset error, which after correction, can result in missing code(s) at the lower end of an output code scale. One or more of the examples disclosed herein can provide a new offset compensation mechanism that avoids or reduces this situation. The proposed idea is to, during calibration, sample a so-called Ci (offset-capacitor, which may be referred to as a special CDAC cap with a known weight such as 64) that is connected to Vrefh, and use the converted result as an offset compensation value. During a normal ADC operation sampling phase, Ci gets connected to Vrefh as well (while the SAR-capacitors are connected to Vin or Vrefl). This connection scheme will move up the conversion code by the weight of Ci. Then, subtracting the offset compensation value will yield code 0 for zero sampled voltage.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A SAR ADC comprising:
a plurality of SAR-capacitors;
for each of the SAR-capacitors, a sampling-switching-block configured to connect a first plate of the associated SAR-capacitor to either: v-ref-low, v-ref-high or an input-voltage;
an offset-capacitor;
an offset-switching-block configured to connect a first plate of the offset-capacitor to either: v-ref-low, or v-ref-high;
a SAR machine configured to:
provide signals to the sampling-switching-blocks and the offset-switching-block in order to define a calibration-sampling-mode-of-operation, a calibration-conversion-mode-of-operation, a sampling-mode-of-operation and a conversion-mode-of-operation, wherein:
in the calibration-sampling-mode-of-operation, the SAR-capacitors are connected to v-ref-low, and the offset-capacitor is connected to v-ref-high;
in the calibration-conversion-mode-of-operation, the SAR-capacitors are connected to either v-ref-low or v-ref-high, and the offset-capacitor is connected to v-ref-low;
in the sampling-mode-of-operation, one or more of the SAR-capacitors are connected to the input-voltage, and the offset-capacitor is connected to v-ref-high; and
in the conversion-mode-of-operation, the SAR-capacitors are connected to either v-ref-low or v-ref-high, and the offset-capacitor is connected to v-ref-low; and
determine an offset-value based on whether the SAR-capacitors are connected to v-ref-low or v-ref-high at an end of the calibration-conversion-mode-of-operation;
provide a raw-digital-word based on whether the SAR-capacitors are connected to v-ref-low or v-ref-high at an end of the conversion-mode-of-operation; and
a code converter configured to subtract the offset-value from the raw-digital-word in order to provide a digital-output-signal.

2. The SAR ADC of claim 1, wherein the SAR machine is configured to provide a calibration-digital-word based on whether the SAR-capacitors are connected to v-ref-low or v-ref-high at an end of the calibration conversion-mode-of-operation, and wherein the SAR ADC is configured to determine the offset-value based on the calibration-digital-word.

3. The SAR ADC of claim 1, wherein, in the sampling-mode-of-operation, the SAR machine is configured to connect a first-subset of the SAR-capacitors to the input-voltage.

4. The SAR ADC of claim 1, wherein, in the sampling-mode-of-operation, the SAR machine is configured to connect a second-subset of the SAR-capacitors to v-ref-low.

5. The SAR ADC of claim 1, wherein, in the conversion-mode-of-operation, the SAR machine is configured to connect all of the SAR-capacitors to either v-ref-low or v-ref-high.

6. The SAR ADC of claim 1, further comprising:
a range-extender-capacitor; and
a range-extender-switching-block configured to connect a first plate of the range-extender-capacitor to either: v-ref-low, or the input-voltage; and
wherein the SAR machine is configured to provide signals to the range-extender-switching-block such that:
in the sampling-mode-of-operation, the range-extender-capacitor is connected to the input-voltage; and
in the conversion-mode-of-operation, the range-extender-capacitor is connected to v-ref-low.

7. The SAR ADC of claim 6, wherein the SAR machine is configured to provide signals to the range-extender-switching-block such that:
in the calibration-sampling-mode-of-operation, the range-extender-capacitor is connected to v-ref-low; and
in the calibration-conversion-mode-of-operation, the range-extender-capacitor is connected to v-ref-low.

8. The SAR ADC of claim 1, further comprising a comparator, wherein the comparator has a first-comparator-input-terminal and a second-comparator-input-terminal, wherein the first-comparator-input-terminal is connected to second plates of each of the SAR-capacitors and the offset-capacitor, and wherein the second-comparator-input-terminal is configured to be selectively connected to an autozero-voltage-supply.

9. The SAR ADC of claim 8, wherein the offset-capacitor is configured to provide an additional-voltage to the first-comparator-input-terminal when it is connected to v-ref-high.

10. The SAR ADC of claim 8, further comprising an autozero-switching block configured to:
   connect a second plate of each of the SAR-capacitors to the autozero-voltage-supply in the sampling-mode-of-operation, and
   disconnect the second plate of each of the SAR-capacitors from the autozero-voltage-supply in the conversion-mode-of-operation.

11. The SAR ADC of claim 8, wherein the autozero-switching block is configured to:
   connect the second-comparator-input-terminal to the autozero-voltage-supply in the sampling-mode-of-operation, and
   disconnect the second-comparator-input-terminal from the autozero-voltage-supply in the conversion-mode-of-operation.

12. The SAR ADC of vlsim 8, wherein the autozero-switching block is configured to:
   connect the second plate of each of the SAR-capacitors to the autozero-voltage-supply in the calibration-sampling-mode-of-operation, and
   disconnect the second plate of each of the SAR-capacitors from the autozero-voltage-supply in the calibration-conversion-mode-of-operation.

13. The SAR ADC of claim 8, wherein the autozero-switching block is configured to:
   connect the second-comparator-input-terminal to the autozero-voltage-supply in the calibration-sampling-mode-of-operation, and
   disconnect the second-comparator-input-terminal from the autozero-voltage-supply in the calibration-conversion-mode-of-operation.

14. The SAR ADC of claim 8, further comprising a reference-capacitor-array and a reference-switching-block, wherein the reference-capacitor-array comprises one or more reference-capacitors, wherein each reference-capacitor has:
   a second plate that is connected to the second-comparator-input-terminal of the comparator; and
   a first plate that is connected to the reference-switching-block;
wherein the capacitance of the reference-capacitor-array corresponds to the capacitance of the capacitors that are connected to the first-comparator-input-terminal.

15. A method of operating a SAR ADC, wherein the SAR ADC comprises a plurality of SAR-capacitors; a sampling-switching-block for each of the SAR-capacitors; an offset-capacitor; and an offset-switching-block, wherein the method comprises:
   providing signals to the sampling-switching-blocks and the offset-switching-block in order to define a calibration-sampling-mode-of-operation, a calibration-conversion-mode-of-operation, a sampling-mode-of-operation and a conversion-mode-of-operation, wherein:
      in the calibration-sampling-mode-of-operation, the SAR-capacitors are connected to v-ref-low, and the offset-capacitor is connected to v-ref-high;
      in the calibration-conversion-mode-of-operation, the SAR-capacitors are connected to either v-ref-low or v-ref-high, and the offset-capacitor is connected to v-ref-low;
      in the sampling-mode-of-operation, one or more of the SAR-capacitors are connected to an input-voltage, and the offset-capacitor is connected to v-ref-high; and
      in the conversion-mode-of-operation, the SAR-capacitors are connected to either v-ref-low or v-ref-high, and the offset-capacitor is connected to v-ref-low; and
   determining an offset-value based on whether the SAR-capacitors are connected to v-ref-low or v-ref-high at an end of the calibration-conversion-mode-of-operation
   determining a raw-digital-word based on whether the SAR-capacitors are connected to v-ref-low or v-ref-high at an end of the conversion-mode-of-operation; and
   subtracting the offset-value from the raw-digital-word in order to provide a digital-output-signal.

* * * * *